US006861720B1

United States Patent
Heckman et al.

(10) Patent No.: US 6,861,720 B1
(45) Date of Patent: Mar. 1, 2005

(54) PLACEMENT TEMPLATE AND METHOD FOR PLACING OPTICAL DIES

(75) Inventors: James Kent Heckman, Chandler, AZ (US); Stephen Gregory Shermer, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/943,068

(22) Filed: Aug. 29, 2001

(51) Int. Cl.$^7$ ......................................... H01L 31/0203
(52) U.S. Cl. ......................................................... 257/433
(58) Field of Search ........................ 257/81, 431, 432, 257/433, 676, 711, 723, 782, 786; 438/23, 48, 57, 64–67, 118, 127

(56) References Cited

U.S. PATENT DOCUMENTS

| | | | |
|---|---|---|---|
| 3,018,689 A | | 1/1962 | Saxe |
| 3,838,984 A | | 10/1974 | Crane et al. |
| 3,931,922 A | * | 1/1976 | Jackson et al. ................ 228/6 |
| 4,293,190 A | | 10/1981 | Clover |
| 4,318,135 A | | 3/1982 | Allis et al. |
| 4,457,017 A | | 6/1984 | Onogi et al. |
| 4,591,901 A | | 5/1986 | Andrevski |

(List continued on next page.)

FOREIGN PATENT DOCUMENTS

| | | |
|---|---|---|
| DE | 43 19 786 A1 | 6/1993 |
| EP | 0 687 008 A2 | 6/1995 |
| JP | 53-127101 | 10/1978 |
| JP | 54-095006 | 7/1979 |
| JP | 56-209264 | 12/1981 |
| JP | 58-040579 | 3/1983 |
| JP | 60-160257 | 7/1985 |
| JP | 60-288127 | 12/1985 |
| JP | 61-273445 | 11/1986 |
| JP | 62-185911 | 7/1987 |
| JP | 62-211993 | 8/1987 |
| JP | 06-102369 | 5/1994 |
| JP | 59-167037 | 9/1994 |
| JP | 07-110380 | 5/1995 |
| JP | 08-124888 | 5/1996 |

*Primary Examiner*—Carl Whitehead, Jr.
*Assistant Examiner*—Jennifer M. Dolan
(74) *Attorney, Agent, or Firm*—Weiss, Moy & Harris, P.C.

(57) ABSTRACT

A placement template and method for placing optical dies provides an alternative to large-die implementation for microelectromechanical systems (MEMS). Multiple dies are aligned by a template mounted on the substrate. Apertures in the template receive the dies and protrusions at the edges of the apertures guide the dies during mounting. The protrusions may be tapered having a narrow end farthest from the substrate to provide self-alignment of the dies as they are placed. The template may be epitaxially grown from a semiconductor material on either the substrate or a backing layer. The template may also be etched, stamped or otherwise formed from a metal or ceramic layer. A separate template may be bonded to a ceramic or other substrate by an eutectoid bond, providing carefully controlled template placement on the substrate.

30 Claims, 3 Drawing Sheets

U.S. PATENT DOCUMENTS

| | | | |
|---|---|---|---|
| 4,594,613 A | | 6/1986 | Shinbori et al. |
| 4,691,225 A | | 9/1987 | Murakami et al. |
| 4,801,998 A | | 1/1989 | Okuaki |
| 4,803,557 A | | 2/1989 | Bridges |
| 5,057,905 A | | 10/1991 | Matsumoto et al. |
| 5,070,041 A | | 12/1991 | Katayama et al. |
| 5,074,036 A | * | 12/1991 | Dunaway et al. .............. 29/834 |
| 5,117,279 A | | 5/1992 | Karpman |
| 5,122,862 A | | 6/1992 | Kajihara et al. |
| 5,159,432 A | | 10/1992 | Ohkubo et al. |
| 5,230,759 A | | 7/1993 | Hiraiwa |
| 5,256,901 A | | 10/1993 | Ohahi et al. |
| 5,258,094 A | | 11/1993 | Furui et al. |
| 5,267,043 A | | 11/1993 | Rottner et al. |
| 5,298,791 A | * | 3/1994 | Liberty et al. .............. 257/707 |
| 5,336,931 A | | 8/1994 | Juskey et al. |
| 5,368,880 A | * | 11/1994 | McKee et al. .............. 427/125 |
| 5,435,057 A | | 7/1995 | Bindra et al. |
| 5,436,203 A | | 7/1995 | Lin |
| 5,446,960 A | * | 9/1995 | Isaacs et al. .................. 29/834 |
| 5,497,032 A | | 3/1996 | Tsuji et al. |
| 5,529,959 A | | 6/1996 | Yamanaka |
| 5,559,556 A | | 9/1996 | Kagebeck |
| 5,561,328 A | * | 10/1996 | Massingill et al. ......... 257/786 |
| 5,579,164 A | | 11/1996 | Chapnik |
| 5,644,169 A | | 7/1997 | Chun |
| 5,656,857 A | | 8/1997 | Kishita |
| 5,776,798 A | | 7/1998 | Quan et al. |
| 5,821,532 A | | 10/1998 | Beaman et al. |
| 5,824,186 A | * | 10/1998 | Smith et al. ................. 438/597 |
| 5,828,409 A | | 10/1998 | North et al. |
| 5,859,471 A | | 1/1999 | Kuraishi et al. |
| 5,861,680 A | | 1/1999 | Yamanaka |
| 5,866,953 A | | 2/1999 | Akram et al. |
| 5,867,368 A | | 2/1999 | Glenn |
| 5,877,043 A | | 3/1999 | Alcoe et al. |
| 5,877,546 A | | 3/1999 | You |
| 5,893,723 A | | 4/1999 | Yamanaka |
| 5,895,222 A | | 4/1999 | Moden et al. |
| 5,897,728 A | * | 4/1999 | Cole et al. ................... 156/155 |
| 5,905,301 A | | 5/1999 | Ichikawa et al. |
| 5,949,655 A | | 9/1999 | Glenn |
| 5,950,074 A | | 9/1999 | Glenn et al. |
| 5,962,810 A | | 10/1999 | Glenn |
| 5,972,738 A | | 10/1999 | Vongfuangfoo et al. |
| 5,981,314 A | | 11/1999 | Glenn et al. |
| 5,989,941 A | | 11/1999 | Wensel |
| 5,998,862 A | | 12/1999 | Yamanaka |
| 6,034,429 A | | 3/2000 | Glenn et al. |
| 6,092,281 A | | 7/2000 | Glenn |
| 6,117,193 A | | 9/2000 | Glenn |
| 6,117,705 A | | 9/2000 | Glenn et al. |
| 6,266,197 B1 | | 7/2001 | Glenn et al. |
| 6,274,927 B1 | | 8/2001 | Glenn |
| 6,312,551 B1 | * | 11/2001 | Murayama et al. ......... 156/295 |
| 6,477,286 B1 | * | 11/2002 | Ouchi ......................... 385/14 |
| 6,490,166 B1 | * | 12/2002 | Ramalingam et al. ...... 361/760 |
| 6,531,767 B2 | * | 3/2003 | Shrauger ..................... 257/678 |
| 2002/0110312 A1 | * | 8/2002 | Yang et al. .................. 385/18 |
| 2002/0180016 A1 | * | 12/2002 | Shrauger ..................... 257/678 |
| 2002/0186477 A1 | * | 12/2002 | Wang et al. ................. 359/811 |

* cited by examiner

PLACEMENT TEMPLATE AND METHOD FOR PLACING OPTICAL DIES

FIELD OF THE INVENTION

The present invention relates generally to optical integrated circuits, and more specifically, to a template and method for placing optical dies within an optical integrated circuit.

BACKGROUND OF THE INVENTION

Microelectromechanical systems (MEMS) are presently in development for a variety of applications. MEMS provide three-dimensional circuits and mechanical components to a degree of miniaturization not possible previously. Of particular interest are MEMS micromirrors, which use piezoelectric layers to position an array of mirrors to provide optical switching, beam-forming and other functions. The individual mirrors may be positioned independently, and large arrays of mirrors may be incorporated on a single die.

Large dies such as are used to implement a micromirror array are difficult to mount on an integrated circuit substrate. Typically, an adhesive such as epoxy is used to bond a die to the substrate. However, epoxy and other bonding materials change shape during bonding and curing, so that the tilt and position of the die vary during fabrication and may ultimately deviate from the desired alignment. The ultimate tilt of the die, as well as the ultimate horizontal placement on the substrate affect the alignment of the array and thus the performance of the circuit in a larger system.

Smaller dies are more easily fabricated and placed than large dies, but the relative placement of multiple dies is not controllable with current processes to the degree of accuracy required. Since the mirrors in a micromirror array must be positioned relative to each other within very close tolerances, current processes dictate that the micromirror array be fabricated on a single die. Use of smaller dies would be desirable, as yields from a smaller die fabrication would be greatly improved.

Therefore, it would be desirable to provide a method and apparatus implementing a micromirror array, in which the position of the array on the substrate may be precisely controlled. It would further be desirable to provide a method and apparatus implementing an integrated circuit wherein a plurality of dies may be accurately positioned relative to each other on a substrate.

SUMMARY OF THE INVENTION

A placement template and method for placing dies provides a high accuracy alignment between multiple dies on a substrate. As a result, multiple dies may be used to fabricate microelectromechanical systems (MEMS) devices that would typically require a single die implementation. The template may include apertures to receive each of the individual dies, with protrusions forming the edges of the apertures to provide alignment of the dies during placement.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1A:
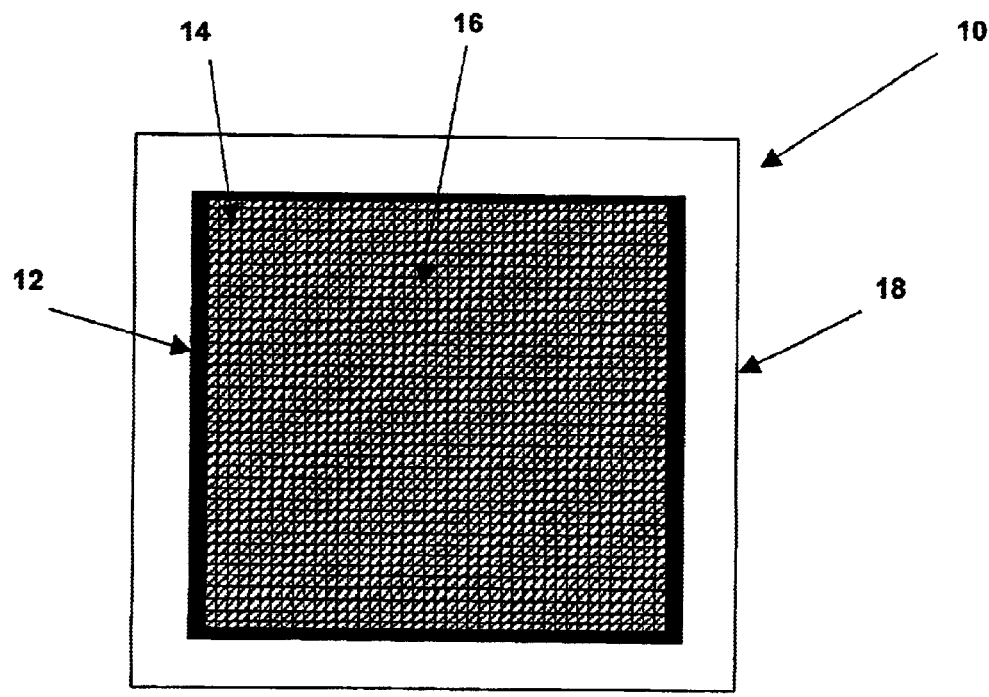
FIG. 1A depicts a top view and FIG. 1B depicts a cross-section of a prior art optical integrated circuit.
Figure 1B:
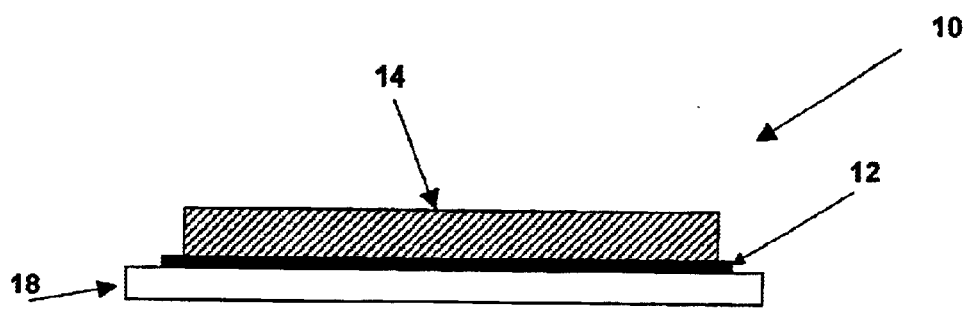

Referring now to the figures and in particular to FIG. 1A and FIG. 1B, a prior art optical integrated circuit 10 is depicted. Integrated circuit 10 comprises a substrate 18, a die 14 and an adhesive for bonding die 14 to substrate 18. Die 14 is a microelectromechanical system (MEMS) die that implements a micromirror array. Approximately 1000 mirrors 16 are fabricated on die 14, with positioning circuitry and transducers located underneath mirrors 16 that form the surface of die 14. By positioning mirrors 16, light may be coupled to other circuits, formed into shaped beams or manipulated for other functions within an optical or optoelectronic system.

In order to use optical integrated circuit 10 in a larger system, alignment of the mirror array on the surface of die 14 must be controlled. This is generally accomplished by controlling the position and tilt of die 14 on substrate 18. But, existing processes for mounting a die on a substrate (that are generally the processes developed for electronic circuits in which placement is not as critical), produce lower than desirable yields due to variation of adhesive 14 thickness and adhesive 14 creep during bonding and curing.

Large die have lower yield in the manufacturing process than smaller dies and are more costly to manufacture in general. Larger dies generate more waste than smaller dies since dies are fabricated from cylindrical rods, and a single defect may cause rejection of an entire die. Larger dies are also more difficult to handle and place as described above. Therefore, it is desirable to use smaller dies to fabricate a MEMS integrated circuit, where possible.

It is possible to subdivide a structure such as a micromirror array, producing performance comparable to that of a large die. If the total area of the die is not reduced significantly by the subdivision (e.g., the gaps between the smaller dies are small), the efficiency of the array will be comparable, as long as alignment between the smaller dies is controlled.

However, subdivision of die 14, complicates the placement and adhesive attach problems described above. Since the performance of a micromirror array depends on an accurate relative positioning of the individual mirror elements, subdividing an array requires an even greater placement and bonding precision than required with a single large die.

Figure 2A:
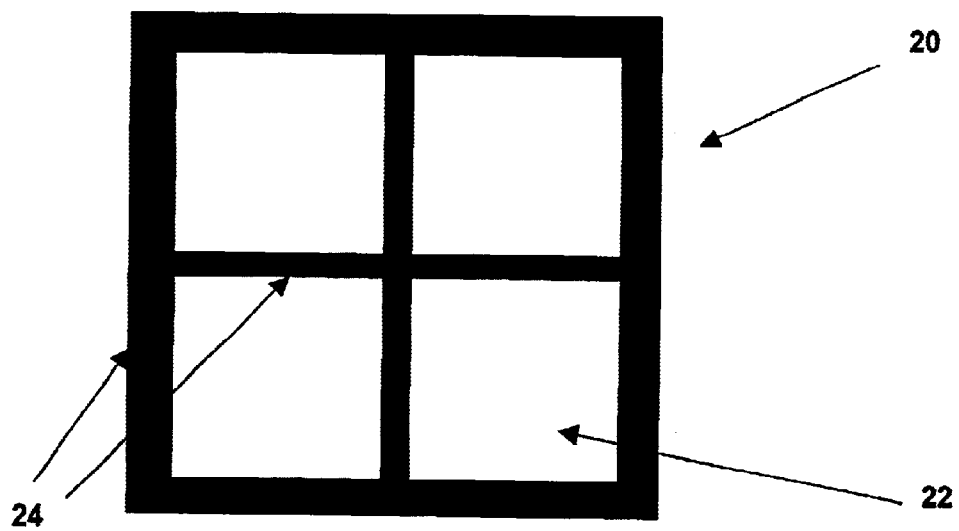
FIG. 2A depicts a top view and FIG. 2B depicts a cross-section of a template in accordance with an embodiment of the invention.
Figure 2B:
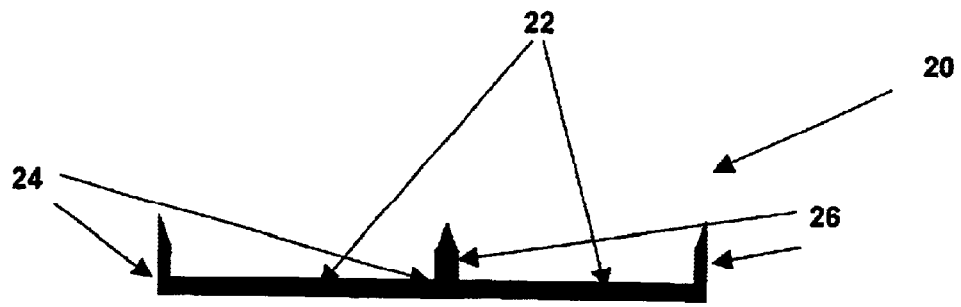

Referring now to FIG. 2A and FIG. 2B, a template 20 in accordance with an embodiment of the invention is depicted. Template 20 is used to control the relative position of multiple smaller dies to achieve the placement accuracy required to produce an array of smaller dies having equivalent performance to a single large die. Apertures 22, are provided in template 20 to receive the smaller dies, and the edges 24 of template 20 are used to guide the dies during placement. Protrusions 26 around the edges of apertures 22, retain and guide the dies, and may be formed with tapered ends, so that the dies will self-align during placement.

Template 20 may be fabricated in a variety of ways. Photolithographic techniques currenty in use for semiconductor manufacture may be used to etch silicon or another material to conform to the shapes required. A ceramic material may be molded or otherwise adapted to form template 20. Alternatively, a metal sheet may be etched or stamped to the required shape. Also, template 20 may be deposited epitaxially on a backing substrate. All of the above processes are continuously improving and have the potential to produce the required accuracy. For example, the relative position of the apertures 22 can be controlled to within 1 $\mu$m to 2 ∞m to achieve the performance of a single die. Edges having a width on the order of 1 m to 2 mm with apertures 25 mm on a side provide 0.1% position accuracy between the smaller dies and a reduction in area of between 4% and 8% over a single large die occupying the same mounting area.

Figure 3A:
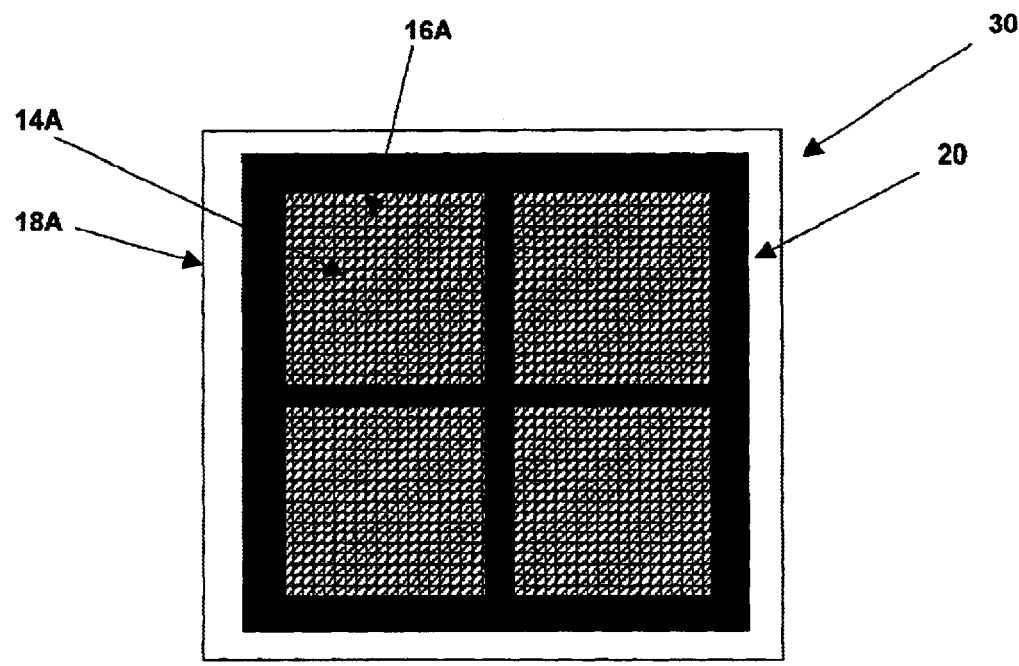
FIG. 3A depicts a top view and FIG. 3B depicts a cross-section of an optical integrated circuit in accordance with an embodiment of the invention.
Figure 3B:
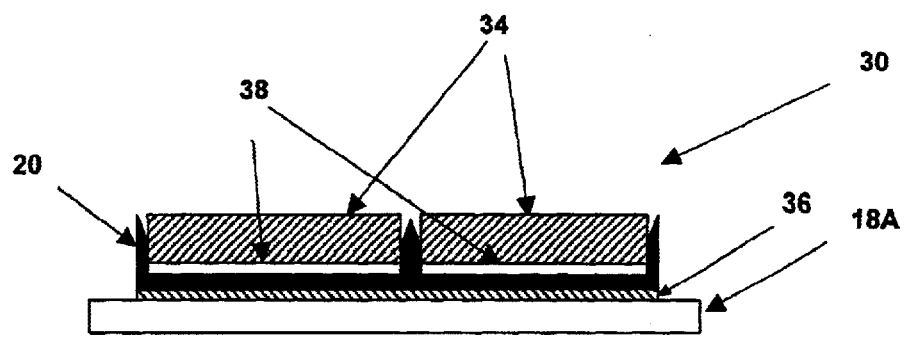

Referring now to FIG. 3A and FIG. 3B, an optical intergrated circuit 30 in accordance with an embodiment of the invention is depicted. Template 20 is bonded to a substrate 18A using a low tilt bonding mechanism, such as a eutectoid bond 36. The eutectoid bond 36 provides a carefully controlled parallel relationship between the lower surface of template 20 and substrate 18A, which will ensure the alignment accuracy of optical integrated circuit 30 within a larger optical system. Then, multiple dies 34 are attached to the assembly with an adhesive 3B, which may be an adhesive film pre-applied to the backs of dies 34, an epoxy bond, or other suitable adhesive process. Template 20 controls the position of dies 34, so that placement of dies 34 is essentially independent of the properties of adhesive 38 and so the original placement will be maintained throughout the bonding and curing process.

As dies 34 are placed in apertures 22 within template 20, protrusions 26 guide dies 34 into place within apertures 22, so that the accuracy of horizontal placement is held to the desired 0.1% relative alignment between dies 34 and tilt is similarly controlled.

Gas flow from behind dies 34 may be provided to improve placement accuracy. Vents may be provided by perforations in substrate 18A and bond 36 or gaps may be provided in adhesive 38, so that trapped air or gas may exit the structure as the dies are placed within apertures 22.

Bond 36 is not required if template is fabricated on substrate 18A directly. Metal may be sputtered or printed onto a ceramic substrate and etched using a photosensitive etchant resist process. Silicon or other suitable material may be sputtered or vapor-deposited onto substrate 18A and template 20 may be etched from the sputtered or deposited layer. Alternatively, template 20 may be epitaxially grown on substrate 18A, once a suitable seed coating is achieved on the surface of substrate 18A.

If template 20 is fabricated separately from substrate 18A, a tin-gold, lead-tin, silver-tin or other solder-type layer may be added to substrate 18A. Template 20 is then placed atop substrate 18A and both are then heated so that a uniform molten layer is produced that will cool to a uniform eutectoid bonding layer 36.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An optical integrated circuit, comprising:
   a substrate;
   a plurality of dies; and
   an etched metal template layer attached to a top of the substrate for aligning the dies by contacting the dies during placement of the dies on the template layer and the substrate, the template layer having a plurality of apertures for receiving the dies, self-alignment features for guiding the dies during placement, and having walls substantially perpendicular to a surface of the substrate for contacting sides of the dies after placement, whereby said dies are precisely located with respect to each other along a the surface of the substrate.

2. The optical integrated circuit of claim 1, wherein the optical integrated circuit is a mirror array and the dies are mirror sub-arrays.

3. The optical integrated circuit of claim 1, wherein the apertures are rectangular apertures for accepting the plurality of dies.

4. The optical integrated circuit of claim 1, wherein the template layer has protrusions perpendicular to the mounting surface of the substrate for guiding the dies during placement.

5. The optical integrated circuit of claim 4, wherein the protrusions are tapered, having a narrow end farthest from the substrate, so that the dies may self-align as the dies are guided toward the substrate.

6. The optical integrated circuit of claim 5, wherein the template layer has rectangular apertures for accepting the plurality of dies, and wherein walls of the rectangular apertures are formed by the protrusions.

7. The optical integrated circuit of claim 1, further comprising an adhesive layer for attaching the dies to the substrate, and wherein the adhesive layer is cut to provide vents to permit the escape of gas during mounting of the dies.

8. The optical integrated circuit of claim 1, wherein the substrate has perforations for permitting the escape of gas during mounting of the dies.

9. The optical integrated circuit of claim 1, wherein the template layer is bonded to the substrate by an eutectoid layer.

10. An optical integrated circuit, comprising:
    a substrate;
    a plurality of mirror sub-arrays;
    means attached to a top layer of the substrate for aligning the plurality of mirror sub-arrays during placement of the plurality of mirror sub-arrays; and
    means for retaining the mirror sub-arrays in precise alignment with respect to each other after placement, and wherein the retaining means and the aligning means are provided in an etched metal layer.

11. An optical integrated circuit, comprising:
    a substrate;
    a plurality of dies; and
    a stamped metal template layer attached to a top of the substrate for aligning the dies by contacting the dies during placement of the dies on the template layer and the substrate, the template layer having a plurality of apertures for receiving the dies, self-alignment features for guiding the dies during placement, and having walls substantially perpendicular to a surface of the substrate for contacting sides of the dies after placement, whereby said dies are precisely located with respect to each other along a the surface of the substrate.

12. The optical integrated circuit of claim 11, wherein the optical integrated circuit is a mirror array and the dies are mirror sub-arrays.

13. The optical integrated circuit of claim 11, wherein the apertures are rectangular apertures for accepting the plurality of dies.

14. The optical integrated circuit of claim 11, wherein the template layer has protrusions perpendicular to the mounting surface of the substrate for guiding the dies during placement.

15. The optical integrated circuit of claim 14, wherein the protrusions are tapered, having a narrow end farthest from the substrate, so that the dies may self-align as the dies are guided toward the substrate.

16. The optical integrated circuit of claim 15, wherein the template layer has rectangular apertures for accepting the plurality of dies, and wherein walls of the rectangular apertures are formed by the protrusions.

17. The optical integrated circuit of claim 11, further comprising an adhesive layer for attaching the dies to the substrate, and wherein the adhesive layer is cut to provide vents to permit the escape of gas during mounting of the dies.

18. The optical integrated circuit of claim 11, wherein the substrate has perforations for permitting the escape of gas during mounting of the dies.

19. The optical integrated circuit of claim 11, wherein the template layer is bonded to the substrate by an eutectoid layer.

20. An optical integrated circuit, comprising:
a substrate;
a plurality of dies; and
an epitaxially grown semiconductor template layer attached to a top of the substrate for aligning the dies by contacting the dies during placement of the dies on the template layer and the substrate, the template layer having a plurality of apertures for receiving the dies, self-alignment features for guiding the dies during placement, and having walls substantially perpendicular to a surface of the substrate for contacting sides of the dies after placement, whereby said dies are precisely located with respect to each other along a the surface of the substrate.

21. The optical integrated circuit of claim 20, wherein the optical integrated circuit is a mirror array and the dies are mirror sub-arrays.

22. The optical integrated circuit of claim 20, wherein the apertures are rectangular apertures for accepting the plurality of dies.

23. The optical integrated circuit of claim 20, wherein the template layer has protrusions perpendicular to the mounting surface of the substrate for guiding the dies during placement.

24. The optical integrated circuit of claim 23, wherein the protrusions are tapered, having a narrow end farthest from the substrate, so that the dies may self-align as the dies are guided toward the substrate.

25. The optical integrated circuit of claim 24, wherein the template layer has rectangular apertures for accepting the plurality of dies, and wherein walls of the rectangular apertures are formed by the protrusions.

26. The optical integrated circuit of claim 20, further comprising an adhesive layer for attaching the dies to the substrate, and wherein the adhesive layer is cut to provide vents to permit the escape of gas during mounting of the dies.

27. The optical integrated circuit of claim 20, wherein the substrate has perforations for permitting the escape of gas during mounting of the dies.

28. The optical integrated circuit of claim 20, wherein the template layer is bonded to the substrate by an eutectoid layer.

29. An optical integrated circuit, comprising:
a substrate;
a plurality of mirror sub-arrays;
means attached to a top layer of the substrate for aligning the plurality of mirror sub-arrays during placement of the plurality of mirror sub-arrays; and
means for retaining the mirror sub-arrays in precise alignment with respect to each other after placement, and wherein the retaining means and the aligning means are provided in a stamped metal layer.

30. An optical integrated circuit, comprising:
a substrate;
a plurality of mirror sub-arrays;
means attached to a top layer of the substrate for aligning the plurality of mirror sub-arrays during placement of the plurality of mirror sub-arrays; and
means for retaining the mirror sub-arrays in precise alignment with respect to each other after placement, and wherein the retaining means and the aligning means are provided in an epitaxially grown semiconductor layer.

* * * * *